United States Patent [19]

Tanimura et al.

[11] 4,016,589
[45] Apr. 5, 1977

[54] SEMICONDUCTOR DEVICE

[75] Inventors: Shigeru Tanimura; Nobuaki Miura; Osamu Asano, all of Kyoto, Japan

[73] Assignee: Omron Tateisi Electronics Co., Ltd., Kyoto, Japan

[22] Filed: Mar. 26, 1974

[21] Appl. No.: 455,008

Related U.S. Application Data

[63] Continuation-in-part of Ser. No. 304,809, Nov. 8, 1972, abandoned.

[30] Foreign Application Priority Data

Nov. 10, 1971 Japan .............................. 46-90139
Mar. 10, 1972 Japan .............................. 47-25021

[52] U.S. Cl. .................................. 357/30; 357/13;
357/15; 357/54
[51] Int. Cl.$^2$ ................. H01L 27/14; H01L 31/00;
H01L 29/48; H01L 29/56
[58] Field of Search .............. 357/7, 15, 16, 30, 54, 357/61, 13

[56] References Cited

UNITED STATES PATENTS

| | | | |
|---|---|---|---|
| 3,106,489 | 10/1963 | Lepsecter ..................... | 357/54 |
| 3,398,021 | 8/1968 | Lehrer et al. .................... | 357/4 |
| 3,497,698 | 2/1970 | Phelan et al. .................... | 357/30 |
| 3,679,949 | 7/1972 | Vekusa et al. .................... | 357/30 |
| 3,872,490 | 3/1975 | Higashi et al. ..................... | 357/15 |

OTHER PUBLICATIONS

Applied Physics Letters; Metal–Dependent Interface States in Thin MOS Structures, vol. 18, No. 9, May 1971, by Kar et al.
Applied Physics Letters; Tunneling Into Interface States of MOS Structures; by Dahlke, vol. 10, No. 10, May 1967.
Solid–State Electronics; Metal–Silicon Schottky Barriers by Turner, pp. 291–300, Mar. 1968.
C. Bulucea et al., "On The MOS Structure In The Avalanche Regime," Alta Frequenza, vol. 39, No. 8, Aug. 1970, pp. 734–740.
S. Kar et al., "Potentials And Direct Current in Si–(20 to 40A°)SiO$_2$–Metal Structures," S.–S. Electronics, vol. 15, 1972, pp. 869–875.

*Primary Examiner*—Andrew J. James
*Attorney, Agent, or Firm*—Staas & Halsey

[57] ABSTRACT

A semiconductor composite having a rectifying characteristic is provided by first forming an insulating film of a semiconductor compound such as SiO$_2$ on a semiconductor substrate of N-type Si to a uniform thickness of 27A to 500A, for example, and then further depositing thereon a tin oxide film. The intermediate insulating film between the SnO$_2$ film and the semiconductor substrate decreases the reverse leakage current, raises the reverse breakdown voltage and makes uniform the reverse breakdown voltage. The semiconductor composite of the present invention, as subjected to a predetermined value of light energy, shows an excellent switching characteristic with respect to a voltage applied to the composite in a reverse direction. Also the semiconductor composite of the present invention, as supplied with a certain value of reverse bias voltage or with no bias, shows an excellent switching characteristic with respect to light energy applied to the composite.

29 Claims, 10 Drawing Figures

SEMICONDUCTOR DEVICE

REFERENCE TO COPENDING APPLICATION

This application is a continuation-in-part of U.S. Pat. Application Ser. No. 304,809 filed Nov. 8, 1972 now abandoned.

BACKGROUND OF THE INVENTION

1. Field of the Invention

The present invention relates to a semiconductor device, and more specifically to an improved semiconductor composite comprising a tin oxide film deposited on a semiconductor substrate and having a rectifying characteristic.

2. Description of the Prior Art

One of the typical existing photoelectric devices made of semiconductor materials is a silicon photoelectric device. As is well known, the silicon photoelectric device is manufactured by forming a P-type diffused layer of a thickness of a few microns or less on the surface of an N-type silicon substrate so that when the light impinges on the P-N junction formed therebetween, photovoltaic energy is generated between the P-type layer and the N-type layer. Also it is well known that the conductivity type of the respective layers may be reversed depending upon the application.

However, this type of silicon photoelectric device is disadvantageous in that the device is expensive as compared with other types of photoelectric devices, such as cadmium sulfide photoelectric devices, mainly because manufacture of the silicon photoelectric devices necessitates a diffusion process which should be carried out at a high temperature and under a carefully controlled condition. Another disadvantage of silicon photoelectric device is that it is of less sensitivity in a short wavelength region of spectral characteristic thereof due to the fact that light energy stranger than the forbidden band energy of the semiconductor does not transmit through the semiconductor to the P-N junction which usually formed at a certain distance from the surface of the semiconductor. Thus, it is essential to make the abovementioned diffused layer extremely thin, preferably as thin as 0.3 micron in order to implement such a device sufficiently sensitive to a shorter wavelength region as well. Nevertheless, formation of a thin diffused layer calls for a high level of diffusion techniques, again resulting in a high cost of this type of device.

If the diffused layer of such silicon photoelectric device could be replaced with a transparent conductive film of metal oxide and if such film could serve the same function as that of the diffused layer, the cost of manufacturing a photoelectric device would be greatly reduced and the resultant device could have a greater scope of application. One of the prior arts of interest in this connection is U.S. Pat. No. 3,679,949, entitled "SEMICONDUCTOR HAVING TIN OXIDE LAYER AND SUBSTRATE," issued July 25, 1972 to Genzo Uekusa et al. and assigned to the same assignee of the present invention. The referenced patent basically discloses a semiconductor composite comprising a film of tin oxide ($SnO_2$) deposited on a semiconductor substrate such as silicon and having a rectifying and photoelectric characteristic therebetween.

More specifically, the referenced patent discloses such composite obtained by a process comprising the steps of heating an N-type silicon single crystal substrate in a quartz tube, introducing a vapor of a tin salt such as dimethyl tin dichloride (($CH_3)_2SnCl_2$) into said quartz tube and having a tin oxide film diposited on said silicon substrate by pyralysis. Such composite comprises a barrier formed between the tin oxide film and the silicon substrate, which barrier is presumably a Schottky barrier and closely resembles a P-N junction in a rectifying characteristic. Such barrier may be advantageously utilized as a rectifying device or photoelectromotive force device. As is well known, the tin oxide film is transparent and conductive. Hence, by so adapting the composite that the light is applied to said barrier through the tin oxide film, a photoelectric device is provided. The spectral response characteristic of such photoelectric device is such that it is more highly sensitive in the visible wavelength region as compared with a conventional silicon photoelectric device. It also exhibits a higher output at lower illumination, and is satisfactory in temperature characteristic and response characteristic. Another advantage of the referenced patent composite is that the composite can be provided with ease and less cost on a mass production basis in view of the fact that the tin oxide layer may be deposited at a lower temperature as compared with a process employed in manufacture of the silicon photoelectric device.

Preferably silicon is employed as a semiconductor substrate material in manufacturing the referenced patent composite. It should be pointed out, however, that the surface of the silicon substrate is likely to be oxidized even at a normal temperature and as a result the silicon substrate as prepared for manufacture of semiconductor devices usually comprises a thin oxide film formed on the surface thereof. Such oxide film typically comprises $SiO_2$. Again it should be pointed out that an additional oxide film is formed on the surface of the substrate in the course of further depositing a tin oxide film on the surface. As a result it was found that the semiconductor composite prepared in accordance with the teaching in the said referenced patent usually comprises a very thin insulating film, typically of $SiO_2$, of a thickness of a few A to approximately 10 A incidentally formed between the tin oxide film and the substrate. Thus it would be readily understood that such undesired intervening layer of insulating film is inevitably formed, unless consideration is given to eliminate such undesired layer.

With a view to investigating in detail what influence the $SiO_2$ layer incidentally formed between the $SnO_2$ layer and the Si substrate has upon performance of the $SnO_2$-Si heterojunction of the composite, the inventors of the present application first removed the $SiO_2$ layer formed on the substrate surface through natural oxidation of the substrate material and then deposited an $SnO_2$ layer on the fresh surface of the substrate by a process and a means for eliminating formation of an $SiO_2$ layer on the substrate surface during deposition of the $SnO_2$ layer, so that a new composite can be provided, which comprises no substantial $SiO_2$ layer between the $SnO_2$ layer and the substrate of the composite. As a result, it was observed that the resultant $SnO_2$-Si composites are not uniform in a reverse breakdown voltage, are of an increased reverse leakage current and of a lowered reverse breakdown voltage. As well known to those skilled in the art, these changes in characteristics with respect to the referenced patent composite are all disadvantageous in various applications of the semiconductor device. Thus the fact was confirmed that formation of the $SiO_2$ film at a junction region of the SnO₂-Si composite has a substantial influence upon the characteristic of the semiconductor device.

Nevertheless, the fact was also confirmed by experiment that the thickness of the SiO₂ film incidentally formed in the SnO₂-Si composite manufactured in accordance with the teaching in the referenced patent does not exceed 15A. It is believed that usually such a very thin SiO₂ layer does not cover the whole surface of the silicon substrate or rather the substrate surface is studded with a plurality of small SiO₂ film areas with irregularities of the film thickness and other film conditions. For this reason it is essentially not possible to provide SnO₂-Si composites of uniform characteristics as a semiconductor device, resulting in unsatisfactory yield rate of manufacture of the device.

SUMMARY OF THE INVENTION

Briefly stated, the present invention comprises a semiconductor composite comprising a semiconductor substrate, an insulating film of even thickness formed on said semiconductor substrate and a film of a tin oxide, preferably stannic oxide (SnO₂), deposited on said insulating film and having a rectifying characteristic. Preferably the material of said semiconductor substrate may be selected from a group consisting of Si, Ge and GaAs. Preferably the material of said insulating film may be selected from a group consisting of SiO₂, Si₃N₄ and GeO₂. The thickness of the insulating film may be chosen to be 27A to 500A, but preferably the thickness of the insulating film may be chosen to be 27A to 300A and more preferably 27A to 100A.

Such a composite can be used as an ordinary rectifier without any incidental radiation energy and, with its SnO₂ layer as a light receiving side, can be used as a photoelectric device. However, other applications of the inventive composite are a voltage controlled switching device and a light controlled switching device. More specifically, it was discovered that the composite, as subjected to radiation energy of a certain value, if the uniform thickness of the SiO₂ film is chosen to be a particular value range, shows an excellent voltage response to a reverse bias voltage applied to the composite. Thus, the composite as subjected to a predetermined value of radiation energy may be used as a switching device which is operable as a function of the voltage applied to the composite in a reverse direction. It was also discovered that the composite as supplied with a certain value of the reverse bias voltage or with no bias, if the thickness of the SiO₂ film is chosen to be a particular value range, shows an excellent radiation response in its reverse current to radiation energy applied as a function of the composite. Thus, the composite may be used as a switching device which is operable as a function of the radiation energy applied to the composite.

Therefore, an object of the present invention is to provide a semiconductor composite of novel structure having a rectifying characteristic.

Another object of the present invention is to provide an improved semiconductor composite having a rectifying characteristic which comprises an SnO₂ film deposited on a semiconductor substrate.

A further object of the present invention is to provide a semiconductor composite comprising an SnO₂ layer deposited on a semiconductor substrate, with an intermediate insulating film of a specific even thickness intervening therebetween.

Still a further object of the present invention is to provide an improved switching device which is operable as a function of a voltage applied thereto in a reverse direction of a rectifying characteristic thereof.

Yet a further object of the present invention is to provide an improved switching device which is operable as a function of radiation energy applied thereto.

These and other objects and features of the present invention will be better understood from the following detailed description in conjunction with the accompanying drawings.

BRIEF DESCRIPTION OF THE DRAWINGS

In all these figures like reference characters designate like parts.

DESCRIPTION OF THE PREFERRED EMBODIMENTS

Figures 1, 2, 3:
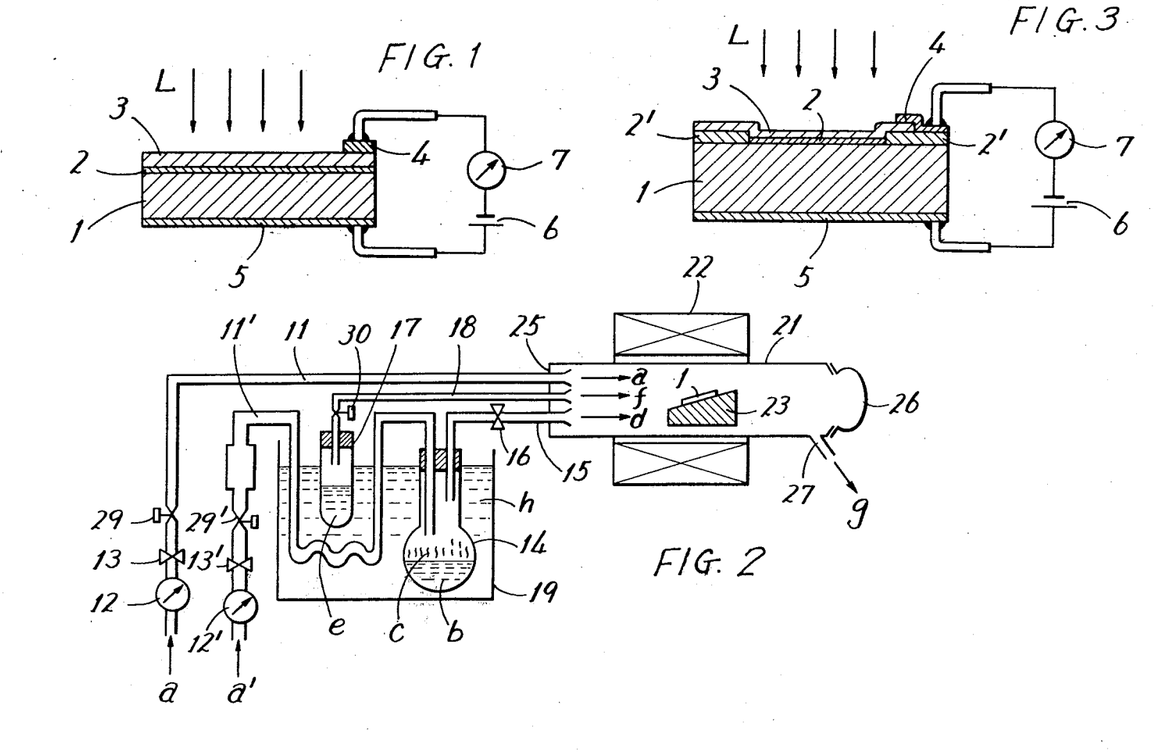
FIG. 1 shows a sectional view of a semiconductor composite in accordance with the present invention.
FIG. 2 shows a preferred arrangement of an apparatus for manufacture of the composite shown in FIG. 1.
FIG. 3 shows a sectional view of a semiconductor composite of a preferred embodiment of the present invention.

Referring to FIG. 1, there is shown a sectional view of a semiconductor composite in accordance with the present invention. The composite shown basically comprises an N-type single crystal silicon substrate 1 with specific resistivity of 1 ohm cm, a substantially uniform layer 2 of silicon dioxide (SiO₂) formed on the said substrate 1, and a layer 3 of tin oxide or stannic oxide (SnO₂) further deposited on the said SiO₂ layer 2. The composite is also shown comprising a metal electrode 4 formed on the SnO₂ layer 3, a metal electrode 5 formed on the substrate 1 and a circuit connection, including an ammeter 7 and a reverse bias voltage source 6 connected to both electrodes 4 and 5.

The thickness of the SiO₂ film is chosen to be about 27A to 500A, as to be more fully discussed subsequently. Thus it is seen that one of the most advantageous features of the present invention is to form positively the uniform SiO₂ layer between the SnO₂ layer and the Si substrate, contrary to expectation in the prior art. The SnO₂ layer of the composite is so chosen as to be well conductive and constitutes itself of N-type semiconductor. The conductivity of this $SnO_2$ layer is close to that of a metal, say about $10^{20}$ atoms/cm$^3$ in terms of free electron concentration. The $SnO_2$ layer 2 having the characteristic of N-type semiconductor can be formed by a rapid chemical reaction yielding $SnO_2$. This is presumably accounted for by the excess of metal or shortage of oxygen resulting from the rapidity of the progress of reaction.

It was discovered that a composite of such structure and composition has a rectifying characteristic and that such composite takes on a photoelectric function, or response characteristic when radiation energy is supplied to the heterojunction formed inside the composite. One of possible interpretations of the discovery is that the said formation of a heterojunction is actually the formation of Schottky barrier between said $SnO_2$ film and the semiconductor substrate, with $SnO_2$ being regarded as a metal.

Referring now to FIG. 2, there is shown a preferred arrangement of apparatus for manufacture of the composite shown in FIG. 1. The apparatus shown comprises a quartz furnace tube 21 surrounded by an electric heater 22, which is capable of controllably heating the reaction zone of the furnace to 400° C to 700° C. Three pipes 11, 18 and 15 are connected to an end wall 25 of the pipe 21. The pipe 11 is used for supplying an oxidizing gas a, such as oxygen, air or a mixture of oxygen and nitrogen therethrough into the tube 21 and is connected through a cock 29, a control valve 13 and a flow meter 12 to an oxidizing gas source as indicated as an arrow followed by the character a. The pipe 18 is used for supplying a water vapor f therethrough into the tube 21 and is connected through a cock 30 to an evaporator 17, which stores water e. The pipe 15 is used for supplying a mixture gas d of a dimethyl tin dichloride vapor c and an inert gas a' therethrough to the tube 21 and is connected through a control valve 16 to an evaporator 14, which stores a liquid b of dimethyl tin dichloride (($CH_3$)$_2$$SnCl_2$). Both evaporators 17 and 14 are immersed into oil h housed in an oil bath 19 so that both evaporators may be controllably heated to 110° C to 150° C by a heater (not shown). A pipe 11', connected to the evaporator 14 at one end thereof and partially immersed into the oil h of the oil bath 19, is connected through a cock 29', a control valve 13' and a flow meter 12' to an inert gas source as indicated as an arrow followed by the character a'. The other end of the furnace tube 21 is closed with a cap 26 and the gas in the furnace pipe 21 is forced out of an exhaust gas outlet 27 at a given flow rate. A quartz board 23 is placed at a reaction zone of the furnace pipe 21 and a silicon wafer 1, as shown in FIG. 1, is placed on the board 23.

In preparation for manufacture of the composite of the present invention, an N-type silicon wafer 1, as processed physically or chemically so as to provide a mirror-polished or rough main surface, as the case may be, is washed by a diluted etching solution of hydrogen fluoride (HF) to remove an $SiO_2$ film which might have been formed on the main surface of the wafer 1. Following the etching step before any substantial amount of natural oxidation takes place, the wafer 1 is placed on the board 23 and is inserted into the quartz furnace tube 21 so that is is positioned at the reaction zone of the tube 21, as shown in FIG. 2. The silicon wafer 1 is then heated by means of the heater 22 up to 400° C through 600° C, and preferably to 520° C, for forming an insulating layer by thermal reaction with an oxidizing gas.

When the said silicon wafer 1 comes to be heated up to the prescribed temperature, the valve 13 and the cocks 29 and 30 are opened, so that the oxidizing gas a and the vapor f are supplied through the pipes 11 and 18, respectively, into the furnace tube 21 to provide an oxidizing atmosphere, such as $O_2$ or air to the reaction zone. While the silicon wafer 1 is subjected to the thermal reaction conditions in an oxidizing atmosphere for 5 minutes, for example, an $SiO_2$ film 2 of 27A or more in thickness is uniformly deposited on the surface of the wafer 1, as shown in FIG. 1. The thickness of the $SiO_2$ film is controllably selected as desired within the range of 27A through 500A, for example, as a function of time period in which the wafer 1 is subjected to the said oxidizing atmosphere. However, in implementing an $SiO_2$ film thicker than 50A, the temperature of the furnace tube 21 may be raised to, say 700° C, thereby reducing the time period required the formation of the $SiO_2$ film of desired thickness without a substantial change of quality of the film. Selection of thickness of the $SiO_2$ film will be more fully discussed subsequently.

When the $SiO_2$ film of a desired substantially even thickness is formed on the wafer surface, the valve 13' and the cock 29' are also opened, so that an inert carrier gas a' is sent through the pipe 11' to the evaporator 14 which stores dimethyl tin dichloride b. As seen in FIG. 2, the inert gas a' is preheated to a certain temperature as it passes through a portion of the pipe 11' immersed into the oil bath 19. The oil bath 19 is heated by means of a heater (not shown), so that the oil h is kept heated to 110° C through 150° C and preferably to 135° C. Accordingly, the evaporator 14 is also heated to produce a vapor of dimethyl tin dichloride therein. The vapor of dimethyl tin dichloride filling within the evaporator 14 is carried together as the carrier gas a' passes through the evaporator 14 and a mixture gas d is introduced into the furnace tube 21, pressure of which is usually reduced by means of a vacuum pump (not shown) connected to the exhaust outlet 27. Concurrently with supply of the mixture gas d, a water vapor f may also be introduced into the furnace pipe 21, as necessary. It was observed that additional introduction of the water vapor into the furnace tube 21 during deposition of the $SnO_2$ film reduces the time period required for deposition of the $SnO_2$ film of desired thickness without a substantial change of quality of the film.

In the reaction zone, $O_2$ and ($CH_3$)$_2$$SnCl_2$ in the mixed gas d undergo pyralysis and oxidization reactions, and a film of tin oxide is firmly deposited on the said $SiO_2$ film 2 on the surface of silicon wafer 1. FIG. 1 shows the sectional structure of the $SnO_2$-$SiO_2$-Si composite thus produced.

The process reaction can be described by the following equation:

$$(CH_3)_2SnCl_2 + O_2 \quad SnO_2 + 2CH_3Cl$$

The tin oxide film formed by this method is of high optical transparency, its transmission rate being higher than 80–90% for light of wavelength 400 m$\mu$–800 m$\mu$. This film is also highly conductive. If desired, however, its conductivity can be further enhanced (resistivity diminished) by incorporation of a small amount of antimony trichloride ($SbCl_3$) into the dimethyl tin dichloride solution b.

It was discovered that an N-type silicon semiconductor is a suitable material for the substrate of said composite. However, a semiconductor composite of the like rectifying characteristic was also able to be implemented with the use of a P-type silicon semiconductor. In using a P-type material, however, it was found to be preferably to carry out the $SnO_2$ deposition reaction at a somewhat higher temperature or to give a proper heat treatment to the composite made by $SnO_2$ deposition at the reaction temperature mentioned above. It was discovered that composites of a similar rectifying characteristic were also able to be manufactured with Ge or GaAs as a substrate material. It was further observed that $Si_3N_4$ or $GeO_2$ may be used in place of $SiO_2$ as an insulating film formed between the $SnO_2$ film and the semiconductor substrate for the purpose of the present invention.

FIG. 3 shows a sectional view of a semiconductor composite of a preferred embodiment of the present invention. The composite shown comprises a substantially uniform film 2' of electrically insulating material such as silicon dioxide of a sufficient thickness, say $0.6\mu$, formed on a portion of the main surface of the semiconductor substrate 1, another film 2 of an insulating material such as silicon dioxide of approximately 27A to 500A formed on an area of said semiconductor substrate 1 through an opening defined by said film 2' and a tin oxide film further deposited on said films 2 and 2', a rectifying barrier being formed between said semiconductor substrate 1 and the tin oxide film 3. The barrier thus formed is confined by said insulating film 2' and is not exposed and hence a favorable characteristic of the device is ensured.

Now that the structural features of the composite of the present invention have been described, various characteristic features of the composite as a semiconductor device will be hereinafter discussed by referring to various graphs. It is pointed out that such various characteristic features were obtained by using a specific example of the inventive composite comprising an N-type single crystal silicon substrate of 2 mm square and $200\mu$ thick and a tin oxide film of 1 mm square and $0.6\mu$ thick.

Figure 4:
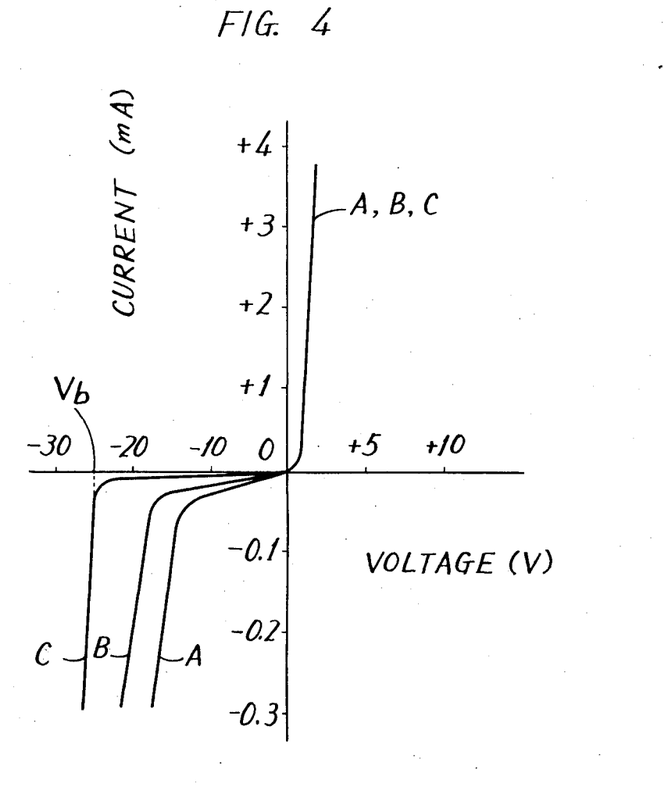
FIG. 4 is a graph showing a comparison of the characteristic of a photoelectric device of the present invention with that of the prior art device.

FIG. 4 is a graph showing a comparison of the characteristic of a photoelectric device of an $SnO_2$-$SiO_2$-Si composite structure fabricated in accordance with the present invention with that of a photoelectric device of an $SnO_2$-Si composite structure fabricated in accordance with the referenced patent. Curve C of FIG. 4 represents the rectifying characteristic of the photoelectric device of the present invention and curves A and B represent for rectifying characteristic of the prior art photoelectric device, both in cases where no light energy is applied to the device. The curve A was obtained using a composite as fabricated so that consideration was taken to eliminate formation of the $SiO_2$ film between the $SnO_2$ film and the Si substrate and the curve B was obtained using a composite as fabricated so that no such particular consideration was taken. As seen from the curves of the graph, a reverse leakage current or dark current of the device of the present invention is much reduced as compared with the prior art device.

Figure 5:
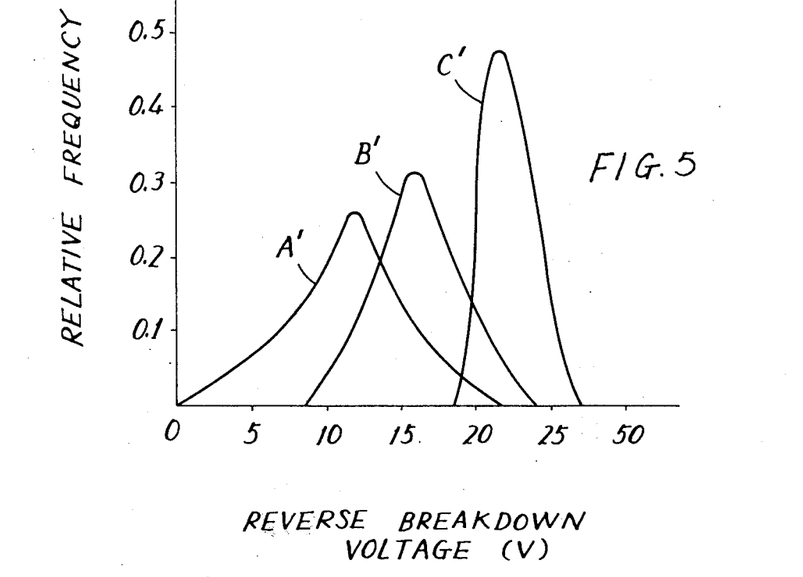
FIG. 5 is a graph showing another comparison in a statistical manner of the characteristic of the photoelectric device of the present invention with that of the prior art device.

FIG. 5 is a graph showing another comparison in a statistical manner of the characteristic of the inventive device with that of the referenced prior art device. In the graph, the ordinate represents relative frequency, while the abscissa represents the reverse breakdown voltage. Curve C' of the graph shows a statistical distribution of the reverse breakdown voltage of the inventive device, while curves A' and B' show that of the referenced prior art device. Again, the curve A was obtained using a composite as fabricated so that consideration was taken to eliminate formation of the $SiO_2$ film between the $SnO_2$ film and the Si substrate and the curve B was obtained using a composite as fabricated so that no such particular consideration was taken. As seen from the graph, the inventive devices fabricated in accordance with the present invention are very uniform in the reverse breakdown voltage, whereas such voltage of the referenced prior art devices are widely distributed.

Figure 6:
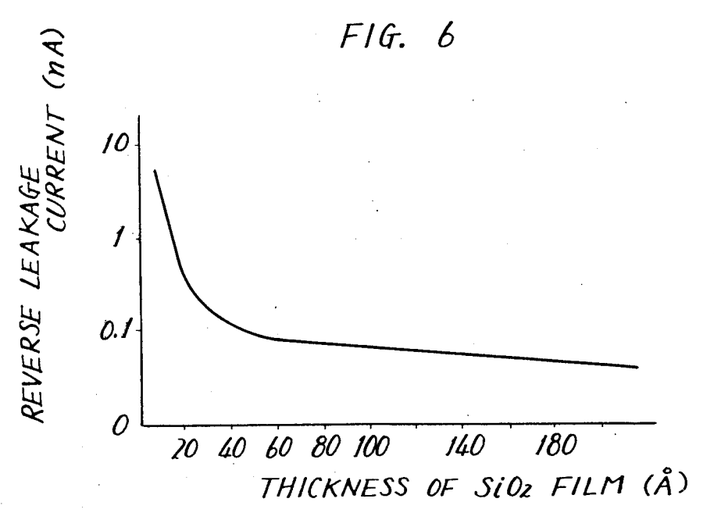
FIG. 6 is a graph showing a relation of the reverse leakage current with thickness of the SiO₂ film of the device of the present invention.

FIG. 6 is a graph showing a relation of reverse leakage current versus thickness of the $SiO_2$ film of the inventive devices in case where no light energy is applied to the devices. As seen from the graph, the thicker the $SiO_2$ film is formed, the more the reverse leakage current is reduced and, in particular, as the thickness of the $SiO_2$ film is increased from about 20 A toward about 60 A, the reverse leakage current is rapidly diminished. It was observed that as the thickness of the $SiO_2$ film is increased up to approximately 500 A the reverse leakage current is accordingly reduced substantially to zero.

Figure 7:
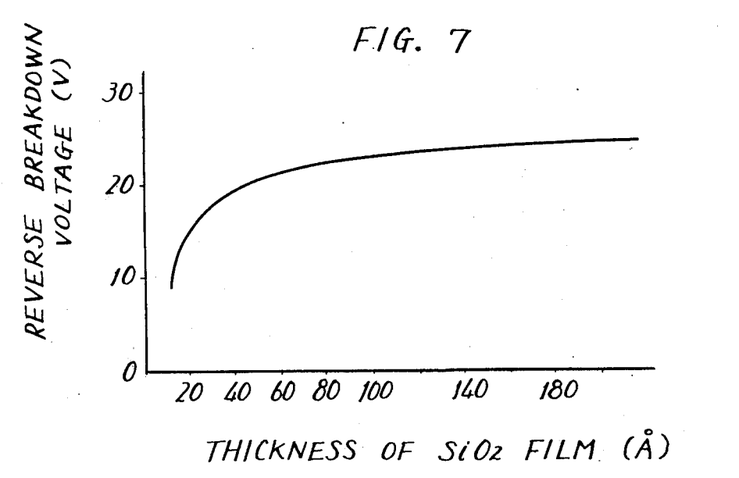
FIG. 7 is a graph showing a relation of the reverse breakdown voltage with thickness of the SiO₂ film of the devices of the present invention.

FIG. 7 is a graph showing a relation of the reverse breakdown voltage versus thickness of the $SiO_2$ film of the inventive devices, in case where no light energy is applied to the devices. As seen from the FIG. 7 graph, contrary to FIG. 6 graph, the thicker the $SiO_2$ film is formed the higher the reverse breakdown voltage becomes and likewise as the thickness of the $SiO_2$ film is increased from about 20 A toward about 60 A, the reverse breakdown voltage becomes rather rapidly higher. It is presumed that the change of the reverse breakdown voltage depending upon the thickness of the $SiO_2$ film results from the fact that the $SiO_2$ layer 2, as the thickness is increased, gradually comes to serve as an insulating film. On the other hand, the $SiO_2$ film of an increased thickness tends to degrade the rectifying characteristic of the device and to lower the photosensitivity of the device. For this reason it is preferred to select the thickness of the $SiO_2$ film less than 300 A and additionally considering the manufacturing process it is more preferred to select the thickness of the film to less than 100 A.

It is recalled that in the foregoing discussion of the various characteristics and features of the inventive device no light energy has not been applied to the device. Surprisingly, however, it was discovered that the inventive device subjected to light energy shows a reverse voltage response and a light response of interest in case where the thickness of the $SiO_2$ film has been selected to a particular value range and in particular such reverse voltage and light responses become rapidly remarkable as the thickness of film is increased to a specific value range.

Figure 8:
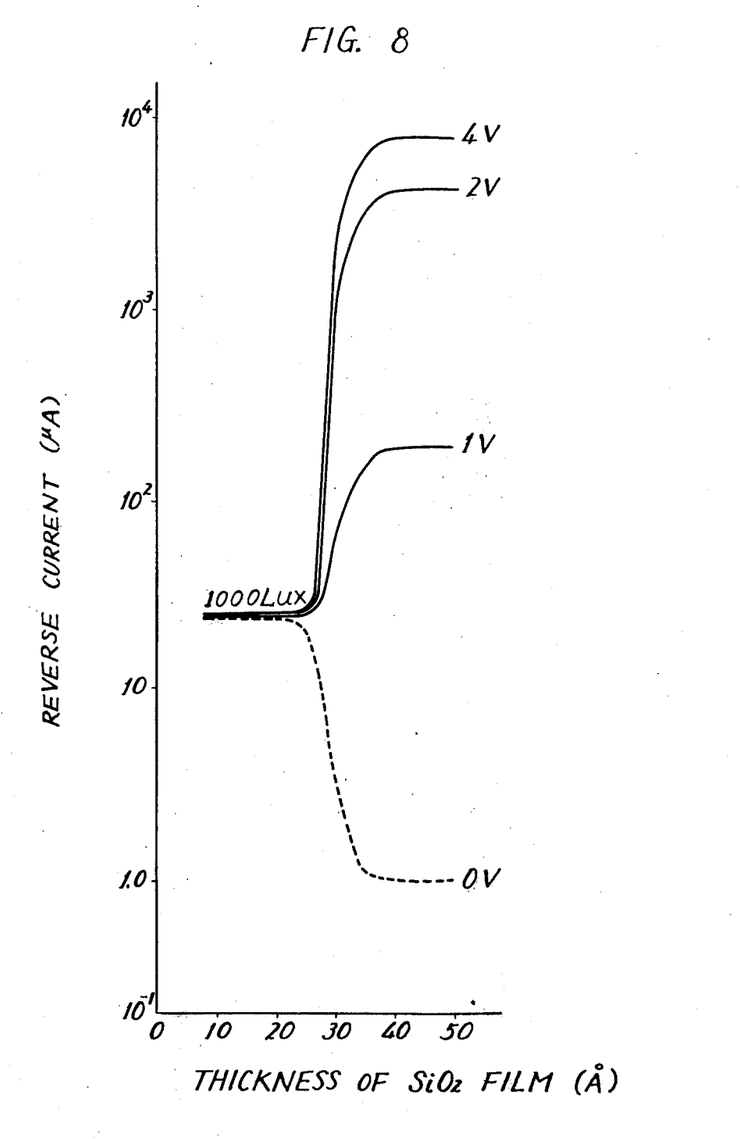
FIG. 8 is a graph showing a relation of a reverse voltage response with the thickness of the SiO₂ film of the devices of the present invention.

FIG. 8 is a graph showing a relation of reverse voltage response with the thickness of the $SiO_2$ film of the inventive devices, in case where the devices are subjected to constant light energy of 1000 lux and a reverse bias voltage from a bias voltage source 6 shown in FIG. 1 is changed to various specific values, say 0, 1, 2, and 4 volt, these being shown as a parameter in FIG. 8 graph. The ordinate of the graph indicates a reverse current calculated in term of $\mu A$ per 4 $mm^2$, while the abscissa indicates the thickness of $SiO_2$ film. As seen from the graph, the inventive device subjected to the light energy shows a pronounced reverse voltage response, provided that thickness of the $SiO_2$ film is chosen to be larger than a specific value, say 27 A, whereas the reverse voltage response of the referenced prior art device is negligible. This means that the inventive device, if subjected to the light energy and the thickness of the $SiO_2$ film is chosen to be a specified value range, can be used as a voltage controlled switching device or a switching device of an excellent characteristic which is operable as a function of a voltage applied to the device in the reverse direction. As seen from the graph, a slightly increased reverse voltage response is already observed in case the $SiO_2$ film is made thicker than smaller specific value, say 20A. However, the reverse voltage response is rapidly increased, as the thickness of the $SiO_2$ film is increased in the vicinity of 28A. It is readily understood that in such a critical region of $SiO_2$ film thickness a slight difference of the film thickness causes lack of uniformity of the characteristic and therefore preferably such critical thickness region of the film is avoided in manufacture of the inventive device for use as a voltage controlled switching device on a mass production basis.

Figure 9:
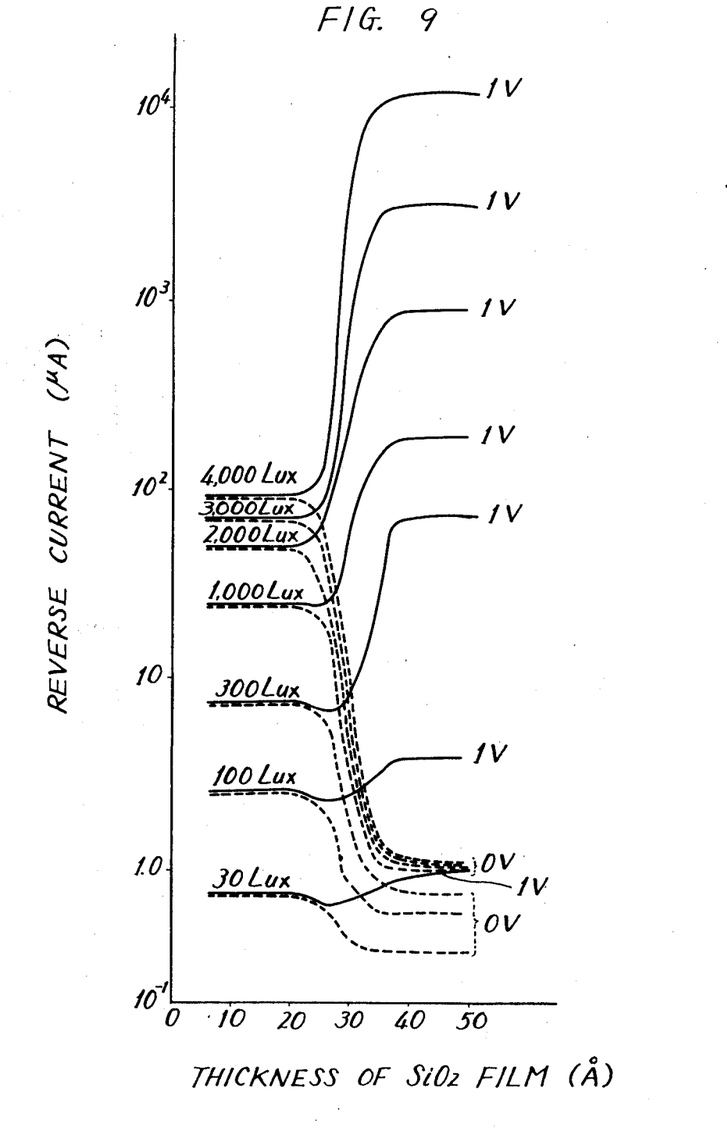
FIG. 9 is a graph showing a relation of a light response as well as a reverse voltage response with the thickness of the SiO₂ film of the device of the present invention.

FIG. 9 is a graph showing a relation of a light response as well as a reverse voltage response with the thickness of the $SiO_2$ film of the inventive device, in cases where the devices are subjected to various values of light energy, say 30, 100, 300, 1000, 2000, 3000, and 4000 lux, these being shown by way of a parameter in the graph, while a reverse bias voltage from a bias voltage source 6 shown in FIG. 1 is changed from zero to one volt, these also being shown by way of a parameter in the graph. The ordinate of the graph indicates a reverse current calculated in terms of $\mu A$ per 4 mm$^2$, while the abscissa indicates the thickness of $SiO_2$ film. The graph also indicates that the inventive device shows a pronounced reverse voltage response, however much light energy may be applied to the device, again so far as the thickness of the $SiO_2$ film is chosen to be larger than a specific value, say 27A, whereas the reverse voltage response of the referenced prior art device is negligible. The graph further indicates that the inventive device, as supplied with a constant reverse bias voltage, say 1 volt, or with a zero bias voltage, shows a light response to the light energy impinging upon the barrier of the device, and the light response is much improved in case the thickness of the $SiO_2$ film is larger than the said specific value, say 27A, although the inventive device also shows an increased light response even in case the $SiO_2$ film is thicker than a specific value, say 20A. This means that the inventive device, if the thickness of the $SiO_2$ film is chosen to be a specified value range, can be used as a light controlled switching device, or a switching device of an excellent characteristic which is operable as a function of light energy applied to the device, irrespective of whether or not the device is supplied with a reverse bias voltage. As seen from the FIG. 9 graph, the inventive device shows a pronounced increase of the light response characteristic as well as the reverse voltage response characteristic, as the thickness of the $SiO_2$ film is increased in the vicinity of the said specific value, say 27A. It is readily understood that in such a critical region of $SiO_2$ film thickness a slight difference of the film thickness causes non-uniformity of the characteristic and therefore preferably such region is avoided in manufacture of the inventive device for use as a light controlled switching device on a mass production basis.

Figure 10:
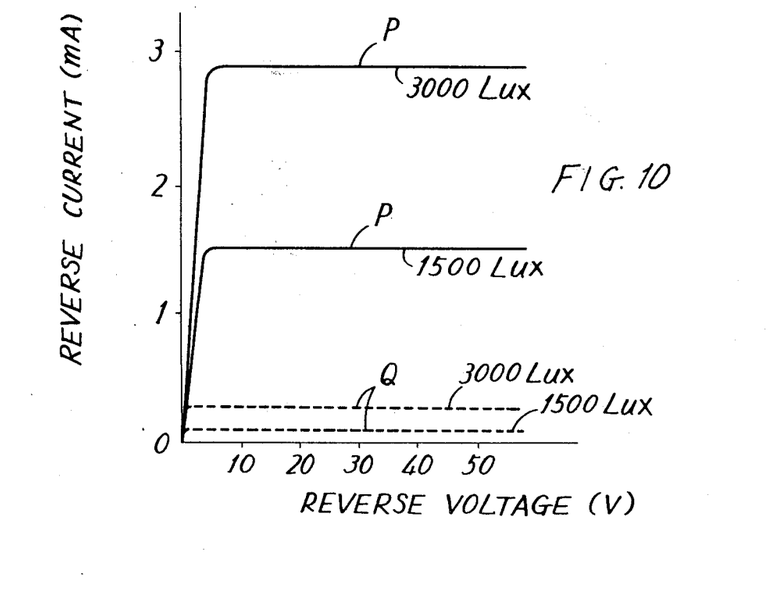
FIG. 10 is a graph showing a comparison of the light response characteristic of the device of the present invention with that of the prior art device.

The light response characteristic of the inventive device is better seen in a graph shown in FIG. 10, in which the ordinate indicates a reverse current in an ordinary scale whereas that of FIG. 9 indicates the current in a logarithmic scale and the abscissa indicates the reverse bias voltage applied to the device, while a change of light energy applied to the device is indicated by way of a parameter. In the graph curves as designated as P show the characteristic of the inventive device and curves as designated as Q show the characteristic of the referenced prior art device. By comparison of both groups of the curves, it is seen that the light response or photosensitivity of the inventive device was raised as high as 30 times as compared with the prior art device.

In the foregoing description as to a manufacturing process of the inventive device by referring to FIG. 2, the $SiO_2$ layer as formed in the natural condition was completely removed by using a solution including hydrogen fluoride, before the $SiO_2$ layer is formed subsequently for the purpose of the present invention. The reason for removing the $SiO_2$ layer as formed in the natural condition is to facilitate controlling of the thickness of the $SiO_2$ film formed for the purpose of the present invention. More specifically, in general the thickness of the $SiO_2$ layer as formed in the natural condition of a silicon wafer prepared for manufacture of the inventive device is different or is not uniform depending upon the lapse of time since the wafer is cut and mirror-polished, environmental conditions in which the wafer is placed, etc. Therefore, formation of the $SiO_2$ film on the wafer for the purpose of the present invention in addition to and under the $SiO_2$ layer as formed in the natural condition makes the resultant $SiO_2$ film uneven in thickness and in quality, resulting in non-uniformity of the reverse voltage characteristic, leakage current, reverse breakdown voltage, etc. By contrast, the above-mentioned pretreatment for removal of the undesired $SiO_2$ layer eliminates such a problem and improves the yield rate of manufacture. However, the $SiO_2$ layer as naturally formed need not be necessarily removed completely. If the layer of even thickness is left behind as a result of the said pretreatment, such film may be used as a portion of the $SiO_2$ layer subsequently formed for the purpose of the present invention by properly controlling the oxidation condition by the oxidizing gas a, such as a temperature and a time period for oxidation.

While specific preferred embodiments of the invention have been described, it will be apparent that obvious variations and modifications of the invention will occur to those of ordinary skill in the art from a consideration of the foregoing description. It is therefore desired that the present invention be limited only by the appended claims.

We claim:

1. A photosensitive semiconductor device comprising:
    a composite including:
        a substrate of a semiconductor selected from the group consisting of Si, Ge and GaAs,
        an insulating layer deposited in substantially uniform thickness on said semiconductor substrate, the material layer being selected from the group consisting of $SiO_2$, $Si_3N_4$ and $GeO_2$, and said insulating layer being in the range of from 27A to 500A in thickness, a tin oxide layer deposited on said insulating layer, metal electrodes deposited on said tin oxide layer and the substrate, said composite having a barrier with rectifying and photoelectric characteristics between said substrate and said tin oxide layer, means connected to said electrodes for applying a reverse bias voltage across the composite less than the reverse breakdown voltage thereof, said composite being adapted for receiving radiation energy at said barrier, and means connected to said electrodes for withdrawing a photosensitive electrical output from between said tin oxide layer and said substrate, whereby said device exhibits a radiation energy response characteristic which is a function of the level of said applied reverse bias voltage and is substantially increased for a thickness of said insulating layer within said range relatively to a thickness outside of said range.

2. The semiconductor composite according to claim 1, in which said semiconductor is Si.

3. The semiconductor composite according to claim 1, in which said semiconductor is N-type conductivity Si.

4. The semiconductor composite according to claim 1, in which said insulating material is $SiO_2$.

5. The semiconductor composite according to claim 4, in which the thickness of the $SiO_2$ layer is chosen to be 27A to 300A.

6. The semiconductor composite according to claim 4 in which the thickness of the $SiO_2$ layer is chosen to be 27A to 100A.

7. The semiconductor composite according to claim 1, in which said tin oxide layer is of a thickness to transmit radiation energy therethrough to said barrier.

8. The semiconductor device according to claim 7 wherein said reverse bias voltage applying means comprises a means for controlling the level of the reverse bias voltage applied to said composite.

9. The semiconductor device according to claim 8 in which said device is disposed to permit a constant level of radiation energy to be applied to the barrier of said device.

10. The semiconductor device according to claim 7 in which a constant level of reverse bias voltage is applied to the composite.

11. The semiconductor device according to claim 7 in which said reverse bias voltage is zero volts.

12. A semiconductor composite according to claim 1, in which said semiconductor substrate has a main surface including a first portion bounded by a second portion, and wherein a second insulating layer of a substantially uniform thickness greater than the thickness of said first mentioned insulating layer is provided on said second portion of the main surface of said substrate, having an opening therein defining said first portion of said main surface, said first mentioned insulating layer is deposited on said first portion of said main surface of said substrate defined by said second insulating layer, and said tin oxide film is deposited on said first mentioned insulating layer.

13. The semiconductor device according to claim 12 in which said tin oxide layer is of a thickness to transmit radiation energy therethrough.

14. The semiconductor device according to claim 13 wherein said reverse bias voltage applying means comprises a voltage source for supplying a bias voltage between said tin oxide layer and said semiconductor substrate in a reverse direction with respect to the rectifying characteristic of the device.

15. A voltage responsive semiconductor switching device comprising:

a substrate of a semiconductor selected from the group consisting of Si, Ge, and GaAs, an insulating layer deposited on said semiconductor substrate, the material of said insulating layer being selected from the group consisting of $SiO_2$, $Si_3N_4$ and $GeO_2$, and said insulating layer being in the range of from about 27A to 500A in thickness, a transparent tin oxide layer deposited on said insulating layer, said semiconductor device having a barrier with rectifying and photoelectric characteristics between said substrate and said tin oxide layer, said barrier having a predetermined reverse breakdown voltage, said device being adapted to receive bias radiation energy at said barrier of said device, means for applying a reverse voltage across the device less than the reverse breakdown voltage of said device, and means for withdrawing an electrical output from between said tin oxide layer and said substrate, whereby said device exhibits a voltage response characteristic which is a function of bias radiation energy received at said barrier and is substantially increased for said thickness of said insulating layer within said range relative to thicknesses thereof outside of said range.

16. A photosensitive semiconductor device comprising:

a substrate of a semiconductor selected from the group consisting of Si, Ge and GaAs, an insulating layer deposited on said semiconductor substrate, the material of said insulating layer being selected from the group consisting of $SiO_2$, $Si_3N_4$ and $GeO_2$, and said insulating layer being in the range of from 27A to 500A in thickness, a tin oxide layer deposited on said insulating layer, said semiconductor device having a barrier with a rectifying and photosensitive characteristic between said substrate and said tin oxide layer, said barrier having a predetermined reverse breakdown voltage, means for applying a reverse bais voltage across the device less than the reverse breakdown voltage of said device, said device being adapted to receive radiation energy at said barrier of said device, and means for withdrawing a photosensitive electrical output from between said tin oxide layer and said substrate, said device exhibiting a radiation energy response characteristic which is a function of said applied reverse bias voltage and is substantially increased for a thickness of said insulating layer within said range thereof relative to a thickness outside of said range.

17. In a semiconductor composite device comprising:

a substrate of a semiconductor selected from the group consisting of Si, Ge and GaAs,
said substrate having any incidentally formed oxide removed,
an insulating layer on said substrate,
a tin oxide layer deposited on said insulating layer
said semiconductor composite device having a barrier with rectifying and photosensitive characteristics between said substrate and said tin oxide layer, and being adapted to receive radiation energy at said barrier of said barrier,
means for applying a reverse bias voltage across the device less than reverse breakdown voltage, and
means for withdrawing a photosensitive electrical output from between said tin oxide layer and said substrate, the improvement which comprises:
said insulating layer being formed on said semiconductor substrate in a uniform thickness in the range of from 27A to 500A, and the material thereon being selected from the group consisting of $SiO_2$, $Si_3N_4$ and $GeO_2$,
said device having a radiation energy response which is a function of said applied reverse bias voltage and which is increased for said uniform insulating layer in said range of thickness relative to an insulating layer outside of said range.

18. The composite device of claim 17 wherein the surface of said substrate has at most an even layer of naturally formed semiconductor oxide thereon, and onto which said insulating layer is deposited, any uneven naturally formed semiconductor oxide thereon being removed by washing said substrate with an etching solution to remove any said uneven naturally formed semiconductor oxide thereon and said insulating layer is positively formed by thermal reaction with an oxidizing gas.

19. The composite device of claim 18 wherein said insulating layer is formed by heating a Si substrate in a reaction zone for at least 5 minutes at 400° C or more thereby to form $SiO_2$ as said insulating layer.

20. In a semiconductor composite comprising an N-type Si semiconductor substrate, an insulating layer on said substrate, and a tin oxide layer deposited on said insulating layer and forming rectifying and photosensitive barrier between said tin oxide layer and said substrate, a metal electrode deposited on a portion of said tin oxide layer, and means for withdrawing an electrical signal from said composite representative of radiation energy received by said barrier and reverse bias voltage applied to said composite, the improvement which comprises:
said insulating layer between said substrate and said tin oxide layer comprising an $SiO_2$ layer having substantially uniform characteristics and thickness, being at least about 27A in thickness, and being substantially uniformly formed by heating said substrate in an oxidizing gas under conditions to obtain said substantially uniform characteristics and thickness.

21. The composite of claim 20 wherein the $SiO_2$ layer is about 27A to 300A thick.

22. A photosensitive semiconductor composite comprising:
a substrate of a semiconductor selected from the group consisting of Si, Ge and GaAs,
said substrate comprising at least one main surface having substantially no naturally formed oxide of the semiconductor thereon,
an insulating layer deposited on said main surface of said semiconductor substrate, the material of said insulating layer being selected from the group consisting of $SiO_2$, $Si_3N_4$, and $GeO_2$ and said insulating layer being in the range of from about 27A to 500A in thickness,
a transparent tin oxide layer deposited on said insulating layer,
said composite having a barrier between said substrate and said tin oxide layer with rectifying and photoelectric characteristics and having a predetermined reverse breakdown voltage,
said composite exhibiting a photosensitive response characteristic to radiation received at said barrier through said transparent tin oxide layer in accordance with a reverse bias voltage, less than the predetermined reverse breakdown voltage, applied across said barrier.

23. A semiconductor composite as recited in claim 22 in which said insulating layer is in the range of from about 27A to 100A in thickness.

24. A voltage responsive semiconductor composite comprising:
a substrate of a semiconductor selected from the group consisting of Si, Ge and GaAs,
said substrate comprising at least one main surface having substantially no naturally formed oxide of the semiconductor thereon,
an insulating layer deposited on said main surface of said semiconductor substrate, the material of said insulating layer being selected from the group consisting of $SiO_2$, $Si_3N_4$, and $GeO_2$ and said insulating layer being in the range of from about 27A to 500A in thickness,
a transparent tin oxide layer deposited on said insulating layer,
said composite having a barrier between said substrate and said tin oxide layer with rectifying and photoelectric characteristics and having a predetermined reverse breakdown voltage,
said composite exhibiting a voltage responsive characteristic to a reverse voltage applied across said barrier, less than the predetermined reverse breakdown voltage, which is a function of the level of radiation energy received at said barrier through said transparent tin oxide layer.

25. A semiconductor composite as recited in claim 24 in which said insulating layer is in the range of from about 27A to 100A in thickness.

26. A voltage responsive semiconductor composite comprising:
a substrate of a semiconductor selected from the group consisting of Si, Ge and GaAs,
said substrate comprising at least one main surface pretreated to reduce any naturally formed oxide of the semiconductor thereon to substantially uniform thickness,
an insulating layer deposited on said main surface of said semiconductor substrate over any naturally formed oxide thereon to form a substantially uniform thickness of an insulating layer in the range of from about 27A to 500A in thickness, the materil of the deposited insulating layer being selected from the group consisting of $SiO_2$, $Si_3N_4$ and $GeO_2$,
said composite exhibiting a photosensitive response characteristic to radiation received at said barrier through said transparent tin oxide layer in accordance with a reverse bias voltage, less than the predetermined reverse breakdown voltage, applied across said barrier.

27. A semiconductor composite as recited in claim 26 in which said insulating layer is in the range of from about 27A to 100A in thickness.

28. A voltage responsive semiconductor composite comprising:
   a substrate of a semiconductor selected from the group consisting of Si, Ge and GaAs,
   said substrate comprising at least one main surface pretreated to reduce any naturally formed oxide of the semiconductor thereon to substantially uniform thickness,
   an insulating layer deposited on said main surface of said semiconductor substrate over any naturally formed oxide thereon to form a substantially uniform thickness of an insulating layer in the range of from about 27A to 500A in thickness, the material of the deposited insulating layer being selected from the group consisting of $SiO_2$, $Si_3N_4$ and $GeO_2$,
   said composite exhibiting a voltage responsive characteristic to a reverse voltage applied across said barrier, less than the predetermined reverse breakdown voltage, which is a function of the level of radiation energy received at said barrier through said transparent tin oxide layer.

29. A semiconductor composite as recited in claim 28 in which said insulating layer is in the range of from about 27A to 100A in thickness.

* * * * *

UNITED STATES PATENT OFFICE
CERTIFICATE OF CORRECTION

Patent No. 4,016,589      Dated April 5, 1977

Inventor(s) Shigeru Tanimura et al.

It is certified that error appears in the above-identified patent and that said Letters Patent are hereby corrected as shown below:

On the face of the patent at "[73] Assignee:" delete "Ltd.".

Column 6, line 20, after "required" delete "the" and insert -- for --.

Column 6, in the equation following line 57, after "$O_2$" and before "SnO" insert -- $\rightarrow$ --.

Column 7, line 52, "for" should be -- the --.

Column 13, line 11, "barrier", second occurrence, should be -- device --.

Signed and Sealed this

*twenty-sixth* Day of *July 1977*

[SEAL]

Attest:

RUTH C. MASON
*Attesting Officer*

C. MARSHALL DANN
*Commissioner of Patents and Trademarks*